United States Patent
Kim et al.

(10) Patent No.: US 10,211,329 B2
(45) Date of Patent: Feb. 19, 2019

(54) CHARGE TRAPPING PREVENTION III-NITRIDE TRANSISTOR

(71) Applicant: Infineon Technologies Americas Corp., El Segundo, CA (US)

(72) Inventors: Hyeongnam Kim, Chandler, AZ (US); Mohamed Imam, Chandler, AZ (US); Alain Charles, Compiegne (FR); Jianwei Wan, Woodbury, MN (US); Mihir Tungare, Roseville, MN (US); Chan Kyung Choi, Woodbury, MN (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/184,032

(22) Filed: Jun. 16, 2016

(65) Prior Publication Data

US 2017/0365701 A1    Dec. 21, 2017

(51) Int. Cl.
| | |
|---|---|
| *H01L 29/778* | (2006.01) |
| *H01L 29/20* | (2006.01) |
| *H01L 29/41* | (2006.01) |
| *H01L 29/205* | (2006.01) |
| *H01L 29/417* | (2006.01) |
| *H01L 29/423* | (2006.01) |

(Continued)

(52) U.S. Cl.
CPC ...... *H01L 29/7787* (2013.01); *H01L 29/2003* (2013.01); *H01L 29/205* (2013.01); *H01L 29/41775* (2013.01); *H01L 29/42356* (2013.01); *H01L 29/7786* (2013.01); *H01L 29/0657* (2013.01); *H01L 29/432* (2013.01)

(58) Field of Classification Search
CPC ........... H01L 29/66462; H01L 27/0605; H01L 29/7787; H01L 29/205; H01L 29/2003; H01L 29/41775; H01L 29/42356; H01L 29/7786; H01L 29/0657; H01L 29/432
See application file for complete search history.

(56) References Cited

U.S. PATENT DOCUMENTS

| | | | | |
|---|---|---|---|---|
| 2004/0227211 | A1* | 11/2004 | Saito | ... H01L 27/0605 257/578 |
| 2011/0210377 | A1* | 9/2011 | Haeberlen | ... H01L 29/2003 257/194 |

(Continued)

*Primary Examiner* — Tom Thomas
*Assistant Examiner* — Benjamin Tzu-Hung Liu
(74) *Attorney, Agent, or Firm* — Murphy, Bilak & Homiller, PLLC (57) ABSTRACT

There are disclosed herein various implementations of a charge trapping prevention III-Nitride transistor. Such a transistor may be a III-Nitride high electron mobility transistor (HEMT) including a III-Nitride intermediate body situated over a substrate, a channel layer situated over the III-Nitride intermediate body, and a barrier layer situated over the channel layer. The channel layer and the barrier layer are configured to produce a two-dimensional electron gas (2DEG). In addition, the III-Nitride transistor includes a dielectric layer situated over the barrier layer, a gate coupled to the barrier layer, and a drain electrode and a source electrode each extending through the dielectric layer. The drain electrode makes ohmic contact with one or both of the barrier layer and a charge trapping prevention layer situated between the dielectric layer and the barrier layer.

18 Claims, 10 Drawing Sheets

(51) Int. Cl.
  *H01L 29/43* (2006.01)
  *H01L 29/06* (2006.01)

(56) References Cited

U.S. PATENT DOCUMENTS

2012/0274402 A1* 11/2012 Kocon .................. H01L 29/402
                                                     330/277
2014/0252368 A1*  9/2014 Lee .................... H01L 29/66462
                                                     257/76
2016/0308039 A1* 10/2016 Saito .................. H01L 29/7786

* cited by examiner

CHARGE TRAPPING PREVENTION III-NITRIDE TRANSISTOR

BACKGROUND

I. Definition

As used herein, "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium. A III-N or a GaN transistor may also refer to a composite high voltage enhancement mode transistor that is formed by connecting the III-N or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

II. Background Art

In high power and high performance circuit applications, group III-V field-effect transistors (FETs), such as gallium nitride (GaN) or other III-Nitride based high electron mobility transistors (HEMTs), are often desirable for their high efficiency and high-voltage operation. III-Nitride and other group III-V HEMTs operate using polarization fields to generate a two-dimensional electron gas (2DEG) allowing for high current densities with low resistive losses. Although their high breakdown voltage, high current density, and very low on-resistance render group III-V HEMTs potentially advantageous for use in power applications, III-Nitride and other group III-V HEMTs are susceptible to having their performance degraded due to charge trapping.

Charge trapping may result from the presence of trap sites residing in the various material layers used to fabricate the HEMT, as well as at interfaces between those layers. For example, trap sites may be found in or at the interface of the active barrier layer of the HEMT and an overlying dielectric or passivation layer. These trap sites can capture electrons, leading to full or partial electron depletion in the channel and can undesirably increase the on-resistance of the HEMT.

SUMMARY

The present disclosure is directed to a charge trapping prevention III-Nitride transistor, substantially as shown in and/or described in connection with at least one of the figures, and as set forth in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As noted above, despite their many desirable performance characteristics, including high breakdown voltage, high current density, and very low on-resistance, III-Nitride and other group III-V high electron mobility transistors (HEMTs) are susceptible to having their performance degraded due to charge trapping. As further noted above, charge trapping may result from the presence of trap sites residing in the various material layers used to fabricate the HEMT, as well as at interfaces between those layers. For example, trap sites may be found in or at the interface of the active barrier layer of the HEMT and an overlying dielectric or passivation layer, and may be particularly problematic in the vicinity of the HEMT drain electrode.

The causes of charge trapping are varied, and may include trap sites formed as point defects (impurities, vacancies, interstitials, for example) or trap sites in the form of dangling bonds at the various bulk, surface, and layer interfaces. Those trap sites can capture electrons, leading to full or partial depletion of electrons in the channel. This can result in increased on-resistance of the HEMT through reduction in the number of conduction electrons.

The present application is directed to III-Nitride HEMTs configured such that the disadvantages associated with charge trapping in conventional device structures are reduced or substantially eliminated. According to various implementations of the present inventive concepts, one or more layers providing charge trap prevention may be formed so as to overlie at least a portion of the active barrier layer of the III-Nitride HEMT. In those disclosed implementations, such a layer or layers are configured to increase the energy barrier above the channel layer of the III-Nitride HEMT in which a two-dimensional electron gas (2DEG) is generated, thereby increasing confinement of electrons within the HEMT 2DEG.

Figure 1A:
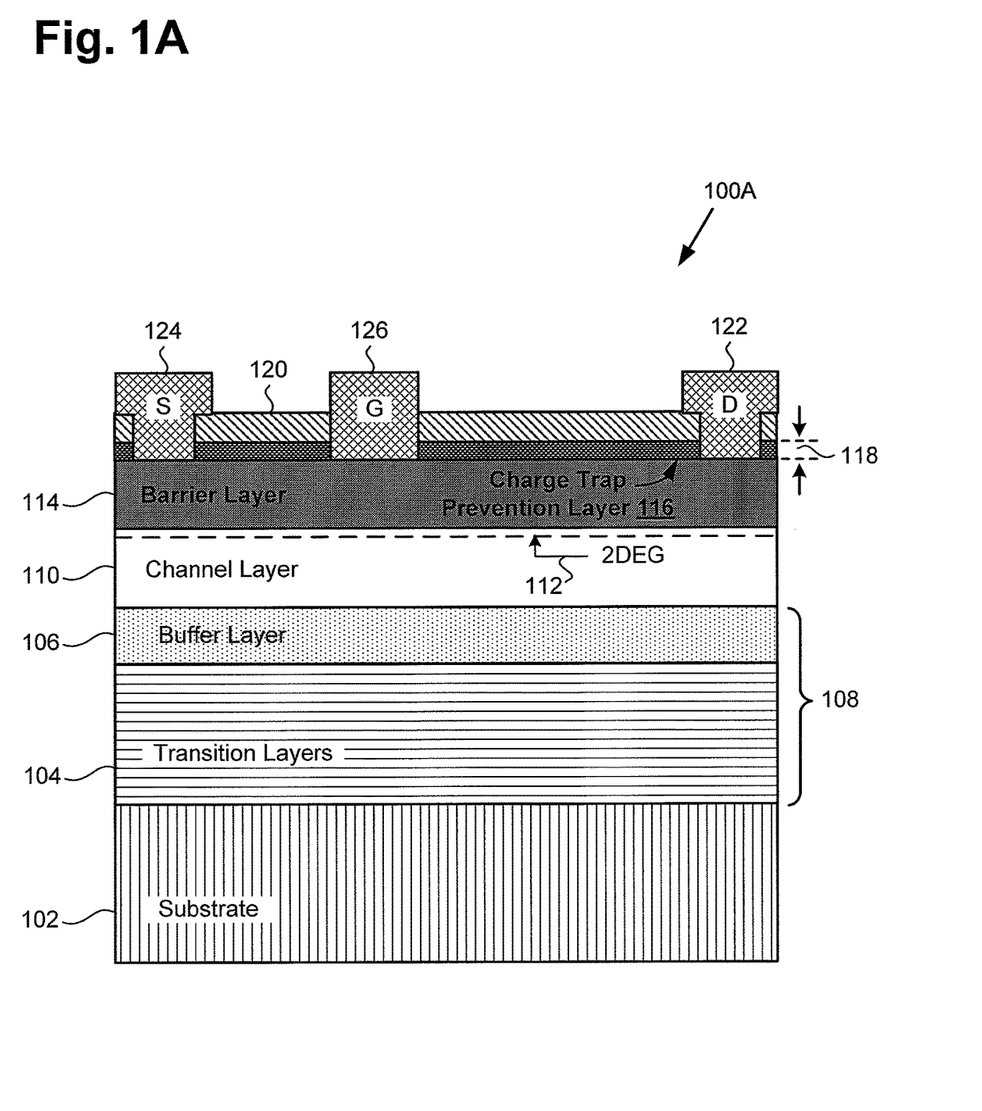
FIG. 1A shows a cross-sectional view of an exemplary III-Nitride high electron mobility transistor (HEMT) including a charge trapping prevention layer, according to one implementation.

FIG. 1A shows a cross-sectional view of exemplary III-Nitride HEMT 100A including a charge trapping prevention layer, according to one implementation. As shown in FIG. 1A, III-Nitride HEMT 100A includes substrate 102, and III-Nitride intermediate body 108 including transition layers 104 and buffer layer 106, situated over substrate 102. In addition, FIG. 1A shows channel layer 110 situated over III-Nitride intermediate body 108, and barrier layer 114 situated over channel layer 110 so as to produce 2DEG 112. Also shown in FIG. 1A are dielectric layer 120 situated over barrier layer 114, and charge trapping prevention layer 116 having thickness 118 and situated between dielectric layer 120 and barrier layer 114.

Moreover, and as further shown in FIG. 1A, III-Nitride HEMT 100A includes drain electrode 122, source electrode 124, and gate 126 in contact, such as Schottky contact, for example, with barrier layer 114. According to the exemplary implementation shown in FIG. 1A, each of drain electrode 122 and source electrode 124 extends through dielectric layer 120, and further extends through charge trapping prevention layer 116, to make ohmic contact with barrier layer 114 and charge trapping prevention layer 116. However, it is noted that in other implementations, drain electrode 122 and source electrode 124 may be situated on and make ohmic contact with charge trapping prevention layer 116. It is further noted that in some implementations, gate 126 may be situated on charge trapping layer so as to make contact, such as Schottky contact, for example, with charge trapping prevention layer 116.

Substrate 102 may be formed of any commonly utilized substrate material. For example, substrate 102 may be formed of sapphire, may be a native III-Nitride substrate, or may be a group IV substrate as described above in the "Definitions" section.

III-Nitride intermediate body 108 includes transition layers 104 and buffer layer 106 situated over transition layers 104. Transition layers 104 may be formed of multiple III-Nitride layers situated over substrate 102. In some implementations, transition layers 104 may take the form of compositionally graded layers having different III-Nitride alloy compositions at their respective top and bottom surfaces.

Although not shown in FIG. 1A, in some implementations, III-Nitride HEMT 100A may also include a strain-absorbing layer formed between substrate 102 and transition layers 104. Such a strain-absorbing layer may be an amorphous strain-absorbing layer, for example, an amorphous silicon nitride layer. It is noted that in implementations in which substrate 102 is a non-native substrate for channel layer 110 and barrier layer 114 (i.e., a non III-Nitride substrate, such as a silicon or other group IV substrate), transition layers 104 are provided to mediate the lattice transition from substrate 102 to buffer layer 106.

In one implementation, transition layers 104 may include a nucleation layer (nucleation layer also not shown in FIG. 1A), in addition to layers formed so as to reduce the net mismatch in thermal coefficient of expansion between substrate 102 and later formed III-Nitride active layers, such as channel layer 110 and barrier layer 114. For instance, when forming a gallium nitride (GaN) based HEMT, transition layers 104 may include an aluminum nitride (AlN) layer formed on substrate 102, or on a strain-absorbing layer and/or a nucleation layer formed on substrate 102, and may further include a series of intermediate layers, such as aluminum gallium nitride (AlGaN) layers having a progressively reduced aluminum content relative to their gallium content, until a suitable transition to a GaN buffer implemented as buffer layer 106 is achieved.

Buffer layer 106 is situated over transition layers 104 and may be formed as an intrinsic III-Nitride material layer or layers. For example, in implementations in which III-Nitride HEMT 100A is a GaN based HEMT, buffer layer 106 may be a GaN based layer. Buffer layer 106 may be formed using any suitable technique for forming III-Nitride based layers, such as molecular-beam epitaxy (MBE), metalorganic chemical vapor deposition (MOCVD), hydride vapor phase epitaxy (HVPE), plasma enhanced vapor phase epitaxy (PECVD), or atomic layer epitaxy (ALE), to name a few suitable approaches. It is noted that any of MBE, MOCVD, HYPE, PECVD, or ALE, for example, may also be used to form transition layers 104.

Channel layer 110 is situated over III-Nitride intermediate body 108, and barrier layer 114 is situated over channel layer 110. Channel layer 110 and barrier layer 114 may be formed using any of MBE, MOCVD, HVPE, PECVD, or ALE, for example. In implementations in which III-Nitride HEMT 100A takes the form of a GaN based HEMT, channel layer 110 be a GaN layer. Barrier layer 114 is formed so as to have a larger bandgap than that of channel layer 110. In implementations in which channel layer 110 is a GaN layer, for example, barrier layer 114 may be an AlGaN layer having a relatively high aluminum concentration. As a specific example, barrier layer 114 may be an AlGaN layer having an aluminum concentration of greater than twenty-one percent (21%), such as an aluminum concentration of approximately 24% or greater. However, in other implementations, barrier layer 114 may have a substantially lower aluminum concentration, such as an aluminum concentration of approximately 10%.

It is noted that in its on-state, III-Nitride HEMT 100A includes 2DEG 112 produced by channel layer 110 and barrier layer 114, and providing a low resistance conduction channel between drain electrode 122 and source electrode 124. As shown in FIG. 1A, 2DEG 112 is generated in channel layer 110, at or near its interface with overlying barrier layer 114. It is further noted that in various applications, III-Nitride HEMT 100A may be implemented as a depletion mode (normally ON) or an enhancement mode (normally OFF) device.

According to the exemplary implementation shown in FIG. 1A, charge trapping prevention layer 116 is situated over barrier layer 114, and is disposed between barrier layer 114 and dielectric layer 120 overlying charge trapping prevention layer 116. Charge trapping prevention layer 116 may be an undoped or P type III-Nitride layer, for example. More specifically, charge trapping prevention layer 116 may be an undoped or P type GaN layer, a P type AlGaN layer, or an undoped or P type indium gallium nitride (InGaN), indium nitride (InN), or aluminum indium gallium nitride (AlInGaN) layer, for instance. Moreover, in some implementations, charge trapping prevention layer 116 may be a multilayer structure including multiple undoped and/or P type III-Nitride layers. Charge trapping prevention layer 116 may be formed over barrier layer 114 to thickness 118 using any of MBE, MOCVD, HYPE, PECVD, or ALE, for example.

In some implementations, thickness 118 of charge trapping prevention layer 116 may be approximately five nanometers (5 nm), or less, such as approximately 2.5 nm, for example. However, in other implementations thickness 118 of charge trapping prevention layer 116 may be substantially greater. For example, in some implementations, thickness 118 of charge trapping prevention layer 116 may be approximately 200 nm.

Dielectric layer 120 may be formed of any dielectric material typically utilized in semiconductor device fabrication. Thus, dielectric layer 120 may be formed as an oxide layer, such as silicon oxide, or may be implemented as nitride passivation layer, such as a silicon nitride passivation layer for example. It is noted that the discussion above regarding substrate 102, transition layers 104, buffer layer 106, channel layer 110, and dielectric layer 120 applies respectively to the substrates, transition bodies, buffer layers, channel layers, and dielectric layers in various other implementations of the present disclosure, such as those discussed in relation to FIGS. 2, 3, 4, and 5 below.

Charge trapping prevention layer 116 is configured to work in combination with barrier layer 114 to reduce or substantially prevent charge trapping by trap sites found in or at the interface of dielectric layer 120 with charge trapping prevention layer 116. For example, charge trapping prevention layer 116 serves to increase the energy barrier between channel layer 110 and dielectric layer 120, thereby enhancing the confinement of electrons within channel layer 110. As a result, the degradation in III-Nitride HEMT performance due to charge trapping in conventional device structures is reduced or substantially eliminated in III-Nitride HEMT 100A due to the presence of charge trapping prevention layer 116.

Figure 1B:
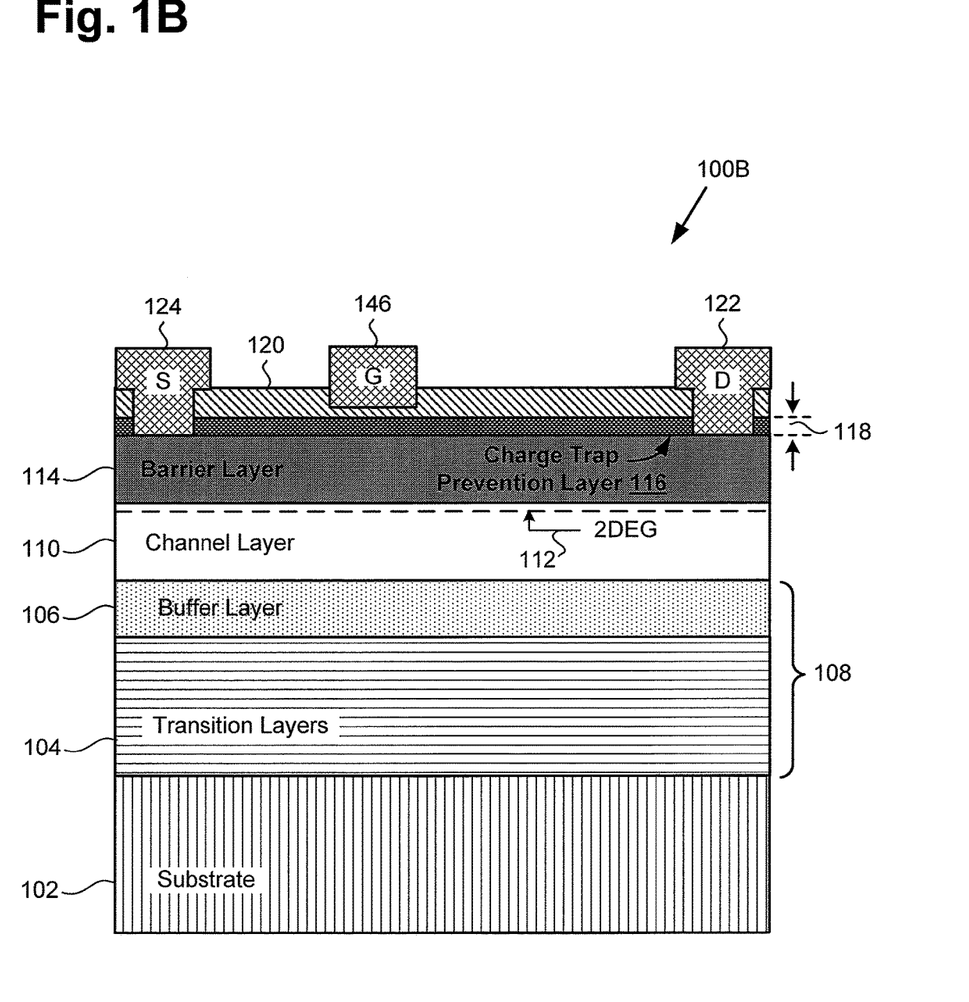
FIG. 1B shows a cross-sectional view of an exemplary III-Nitride HEMT including a charge trapping prevention layer, according to another implementation.

Continuing to FIG. 1B, FIG. 1B shows a cross-sectional view of exemplary III-Nitride HEMT 100B including a charge trapping prevention layer, according to another implementation. It is noted that the features in FIG. 1B identified by reference numbers identical to those shown in FIG. 1A correspond respectively to those previously described features and may share any of the characteristics attributed to those corresponding features, above. III-Nitride HEMT 100B differs from III-Nitride HEMT 100A, in FIG. 1A, in that III-Nitride HEMT 100B is implemented as a metal-insulator-semiconductor field-effect transistor (MISFET) having insulated gate 146. However, it is noted that, like III-Nitride HEMT 100A, III-Nitride HEMT 100B may be implemented as a depletion mode (normally ON) or an enhancement mode (normally OFF) device.

As described above by reference to FIG. 1A, charge trapping prevention layer 116 is configured to work in combination with barrier layer 114 to reduce or substantially prevent charge trapping by trap sites found in or at the interface of dielectric layer 120 with charge trapping prevention layer 116. For example, charge trapping prevention layer 116 serves to increase the energy barrier between channel layer 110 and dielectric layer 120, thereby enhancing the confinement of electrons within channel layer 110. As a result, the degradation in III-Nitride HEMT performance due to charge trapping in conventional device structures is reduced or substantially eliminated in III-Nitride HEMT 100B due to the presence of charge trapping prevention layer 116.

Figure 2A:
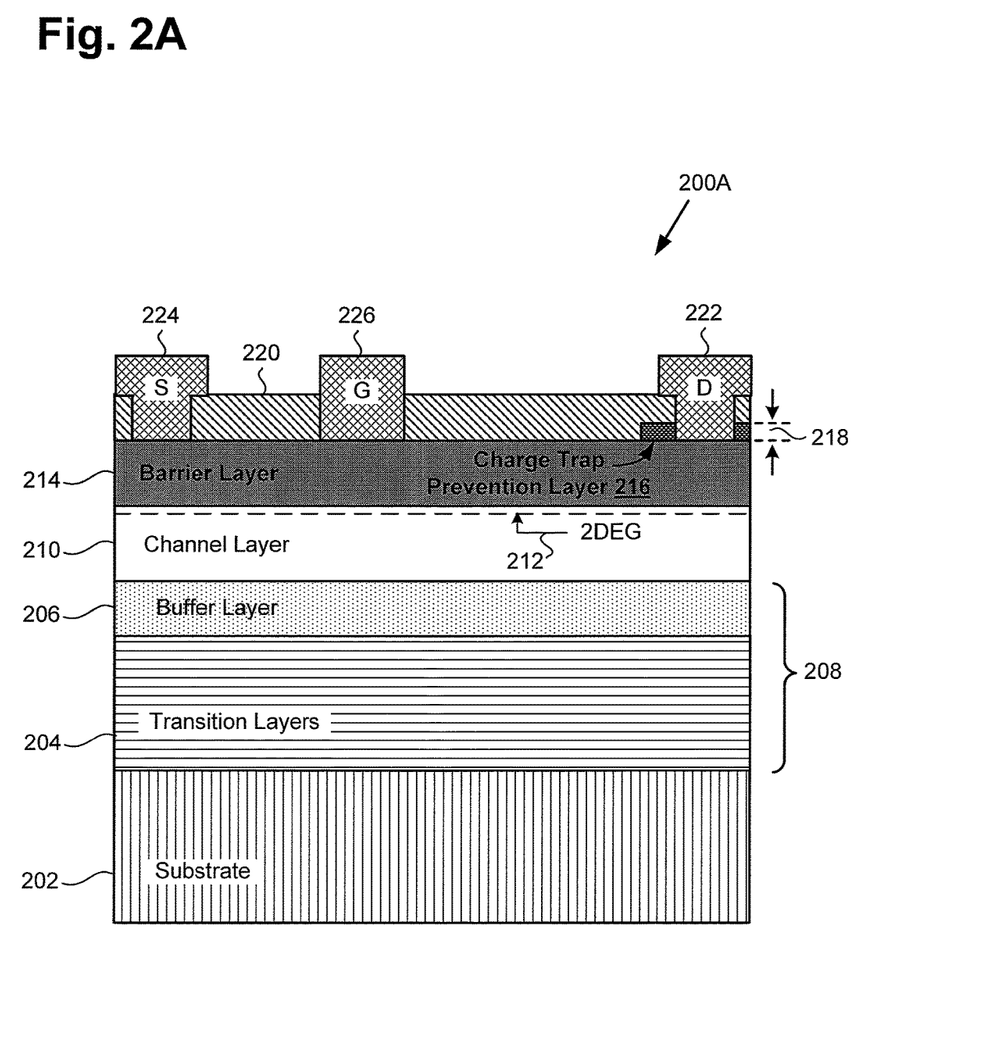
FIG. 2A shows a cross-sectional view of an exemplary III-Nitride HEMT including a charge trapping prevention layer, according to another implementation.

Referring to FIG. 2A, FIG. 2A shows a cross-sectional view of exemplary III-Nitride HEMT 200A including a charge trapping prevention layer, according to another implementation. As shown in FIG. 2A, III-Nitride HEMT 200A includes substrate 202, and III-Nitride intermediate body 208 including transition layers 204 and buffer layer 206, situated over substrate 202. In addition, FIG. 2A shows channel layer 210 situated over III-Nitride intermediate body 208, and barrier layer 214 situated over channel layer 210 so as to produce 2DEG 212.

III-Nitride HEMT 200A further includes drain electrode 222, source electrode 224, and gate 226. Also shown in FIG. 2A are dielectric layer 220 situated over barrier layer 214, and charge trapping prevention layer 216 having thickness 218 and situated between dielectric layer 220 and barrier layer 214 in the vicinity of drain electrode 222. It is noted that in various applications, III-Nitride HEMT 200A may be implemented as a depletion mode (normally ON) or an enhancement mode (normally OFF) device.

Substrate 202, III-Nitride intermediate body 208, channel layer 210, dielectric layer 220, drain electrode 222, and gate 226 correspond in general respectively to substrate 102, III-Nitride intermediate body 108, channel layer 110, dielectric layer 120, drain electrode 122, and gate 126, in FIG. 1A, and may share any of the characteristics attributed to those corresponding features in the present application.

In addition, barrier layer 214 and charge trapping prevention layer 216 having thickness 218, in FIG. 2A, correspond in general respectively to barrier layer 114 and charge trapping prevention layer 116 having thickness 118, in FIG. 1A, and may share any of the characteristics attributed to those corresponding features in the present application.

As noted above, charge trapping may be especially problematic in the vicinity of drain electrode 222, but may not be as great a concern in the vicinity of source electrode 224 and gate 226. In those situations, it may be advantageous or desirable to confine charge trapping prevention layer 216 so as to overlie barrier layer 214 only in regions adjoining or closely adjacent to drain electrode 222.

In other words, and as shown in FIG. 2A, in some implementations, charge trapping prevention layer 216 does not overlie barrier layer 214 between source electrode 224 and gate 226. Consequently, although drain electrode 222 extends through dielectric layer 220 and further extends through charge trapping prevention layer 216 to make ohmic contact with barrier layer 214 and charge trapping prevention layer 216, source electrode 224 does not. Instead, source electrode 224 merely extends through dielectric layer 220 to make ohmic contact with barrier layer 214. It is noted that although FIG. 2A depicts drain electrode 222 as extending through charge trapping prevention layer 216, in other implementations drain electrode 222 may be situated on and make ohmic contact with charge trapping prevention layer 216.

Charge trapping prevention layer 216 is configured to work in combination with barrier layer 214 to reduce or substantially prevent charge trapping by trap sites found in or at the interface of dielectric layer 220 with charge trapping prevention layer 216. For example, charge trapping prevention layer 216 serves to increase the energy barrier between channel layer 210 and dielectric layer 220 in the vicinity of drain electrode 222, thereby enhancing the confinement of electrons within channel layer 210. As a result, the degradation in III-Nitride HEMT performance due to charge trapping in conventional device structures is reduced or substantially eliminated in III-Nitride HEMT 200A due to the presence of charge trapping prevention layer 216 in the vicinity of drain electrode 222.

Figure 2B:
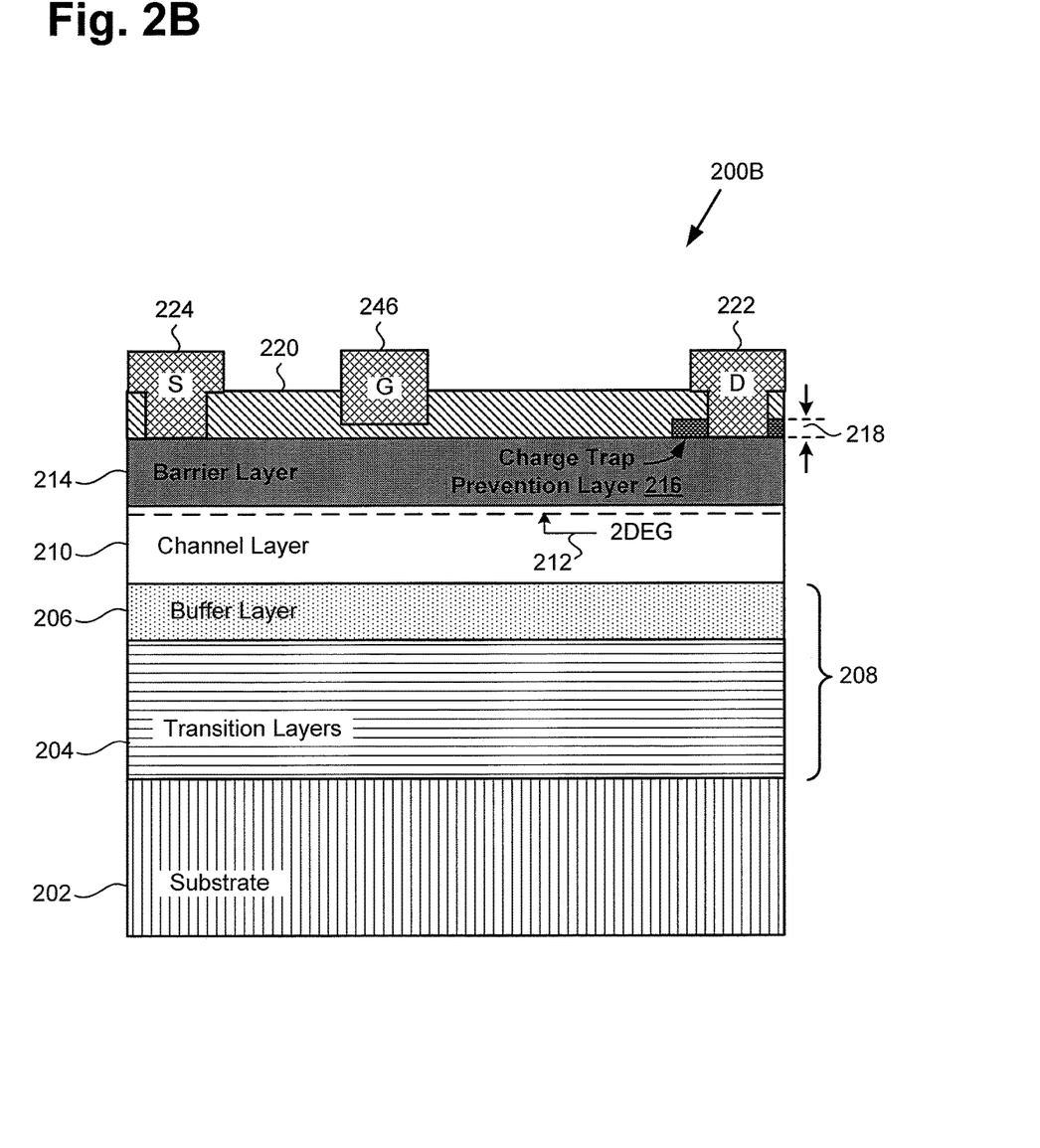
FIG. 2B shows a cross-sectional view of an exemplary III-Nitride HEMT including a charge trapping prevention layer, according to yet another implementation.

Continuing to FIG. 2B, FIG. 2B shows a cross-sectional view of exemplary III-Nitride HEMT 200B including a charge trapping prevention layer, according to yet another implementation. It is noted that the features in FIG. 2B identified by reference numbers identical to those shown in FIG. 2A correspond respectively to those previously described features and may share any of the characteristics attributed to those corresponding features, above. III-Nitride HEMT 200B differs from III-Nitride HEMT 200A, in FIG. 2A, in that III-Nitride HEMT 200B is implemented as a MISFET having insulated gate 246. However, it is noted that, like III-Nitride HEMT 200A, III-Nitride HEMT 200B may be implemented as a depletion mode (normally ON) or an enhancement mode (normally OFF) device.

As described above by reference to FIG. 2A, charge trapping prevention layer 216 is configured to work in combination with barrier layer 214 to reduce or substantially prevent charge trapping by trap sites found in or at the interface of dielectric layer 220 with charge trapping prevention layer 216. For example, charge trapping prevention layer 216 serves to increase the energy barrier between channel layer 210 and dielectric layer 220 in the vicinity of drain electrode 222, thereby enhancing the confinement of electrons within channel layer 210. As a result, the degradation in III-Nitride HEMT performance due to charge trapping in conventional device structures is reduced or substantially eliminated in III-Nitride HEMT 200B due to the presence of charge trapping prevention layer 216 in the vicinity of drain electrode 222.

Figure 3A:
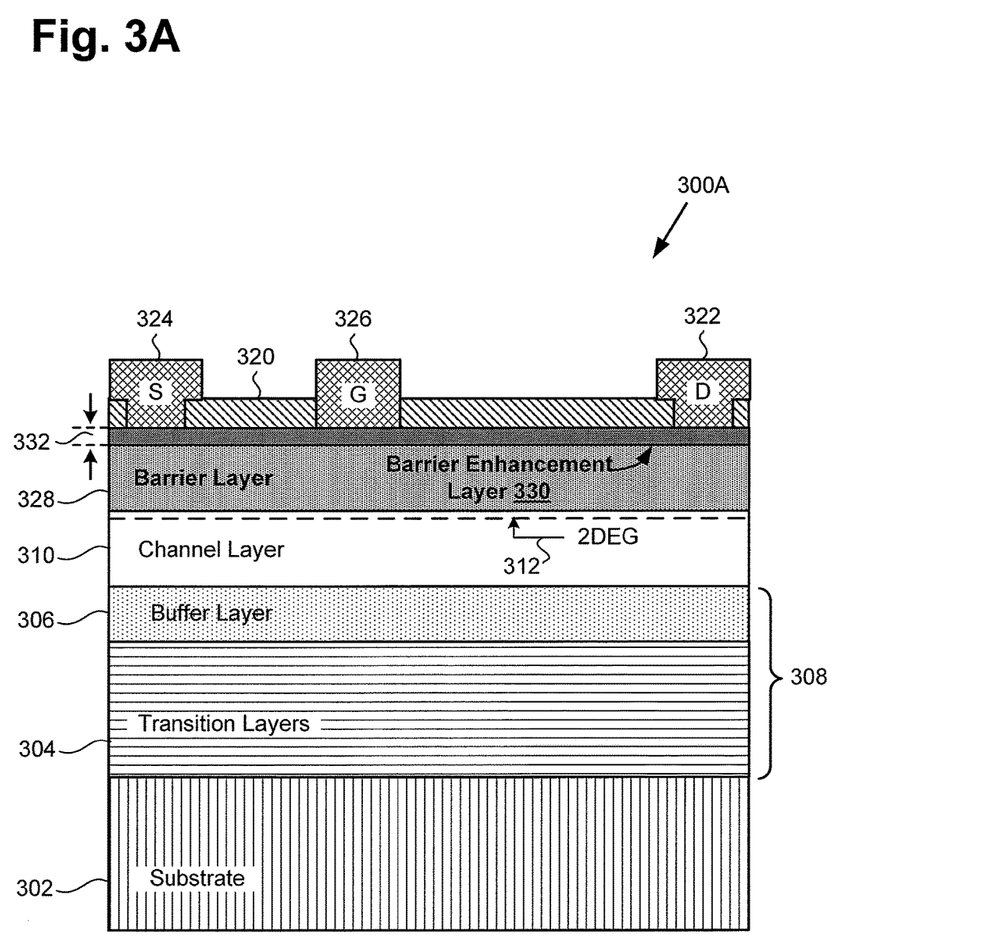
FIG. 3A shows a cross-sectional view of an exemplary III-Nitride HEMT including a barrier enhancement layer providing charge trapping prevention, according to one implementation.

Moving to FIG. 3A, FIG. 3A shows a cross-sectional view of exemplary III-Nitride HEMT 300A including a barrier enhancement layer providing charge trap prevention, according to one implementation. As shown in FIG. 3A, III-Nitride HEMT 300A includes substrate 302, and III-Nitride intermediate body 308 including transition layers 304 and buffer layer 306, situated over substrate 302. In addition, FIG. 3A shows channel layer 310 situated over III-Nitride intermediate body 308, and barrier layer 328 situated over channel layer 310 so as to produce 2DEG 312. Also shown in FIG. 3A are dielectric layer 320 situated over barrier layer 328, and barrier enhancement layer 330 having thickness 332 and situated between dielectric layer 320 and barrier layer 328.

Moreover, and as further shown in FIG. 3A, III-Nitride HEMT 300A includes drain electrode 322, source electrode 324, and gate 326. According to the exemplary implementation shown in FIG. 3A, each of drain electrode 322 and source electrode 324 extends through dielectric layer 320 to make ohmic contact with barrier enhancement layer 330. However, it is noted that in other implementations drain electrode 322 and source electrode 324 may extend through barrier enhancement layer 330 to make ohmic contact with barrier layer 328 and barrier enhancement layer 330. It is further noted that in other implementations, gate 326 may extend through barrier enhancement layer 330 to make contact, such as Schottky contact, for example, with barrier layer 328. In various applications, III-Nitride HEMT 300A may be implemented as a depletion mode (normally ON) or an enhancement mode (normally OFF) device.

Substrate 302, III-Nitride intermediate body 308, channel layer 310, dielectric layer 320, drain electrode 322, source electrode 324, and gate 326 correspond in general respectively to substrate 102, III-Nitride intermediate body 108, channel layer 110, dielectric layer 120, drain electrode 122, source electrode 124, and gate 126, in FIG. 1A, and may share any of the characteristics attributed to those corresponding features in the present application.

Barrier layer 328 is formed so as to have a larger bandgap than that of channel layer 310, and may be formed over channel layer 310 using any of MBE, MOCVD, HVPE, PECVD, or ALE, for example. In implementations in which channel layer 310 is a GaN layer, for example, barrier layer 328 may be an AlGaN layer having a relatively low aluminum concentration. As a specific example, barrier layer 328 may be an AlGaN layer having an aluminum concentration less than or approximately equal to 21%, such as an aluminum concentration in a range from approximately 10% to approximately 21%.

According to the exemplary implementation shown in FIG. 3A, barrier enhancement layer 330 is situated over barrier layer 328, and is disposed between barrier layer 328 and dielectric layer 320 overlying barrier enhancement layer 330. Barrier enhancement layer 330 may be an AlGaN layer having a higher aluminum concentration than barrier layer 328, for instance. For example, barrier enhancement layer 330 may have an aluminum concentration greater than or approximately equal to 23%, and may be formed over barrier layer 328 to thickness 332 using any of MBE, MOCVD, HVPE, PECVD, or ALE. In some implementations, thickness 332 of barrier enhancement layer 330 may be a few nanometers, such as a thickness of less than or approximately equal to 3 nm, for example. However, in other implementations, thickness 332 of barrier enhancement layer 330 may be greater than a few nanometers.

Barrier enhancement layer 330 is configured to work in combination with barrier layer 328 to reduce or substantially prevent charge trapping by trap sites found in or at the interface of dielectric layer 320 with barrier enhancement layer 330. For example, barrier enhancement layer 330 serves to increase the energy barrier between channel layer 310 and dielectric layer 320, thereby enhancing the confinement of electrons within channel layer 310. As a result, the degradation in III-Nitride HEMT performance due to charge trapping in conventional device structures is reduced or substantially eliminated in III-Nitride HEMT 300A due to the presence of barrier enhancement layer 330.

Figure 3B:
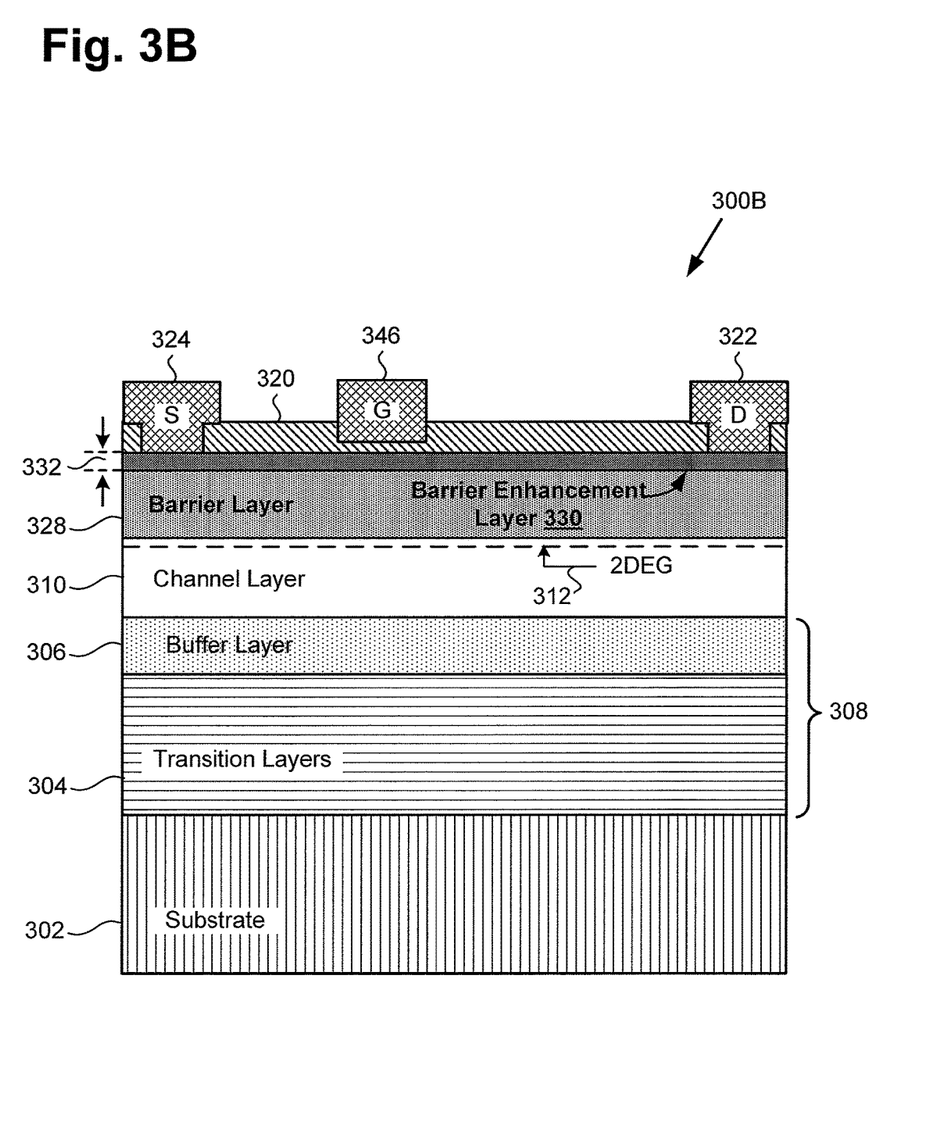
FIG. 3B shows a cross-sectional view of an exemplary III-Nitride HEMT including a barrier enhancement layer providing charge trapping prevention, according to another implementation.

Continuing to FIG. 3B, FIG. 3B shows a cross-sectional view of exemplary III-Nitride HEMT 300B including a barrier enhancement layer providing charge trapping prevention, according to another implementation. It is noted that the features in FIG. 3B identified by reference numbers identical to those shown in FIG. 3A correspond respectively to those previously described features and may share any of the characteristics attributed to those corresponding features, above. III-Nitride HEMT 300B differs from III-Nitride HEMT 300A, in FIG. 3A, in that III-Nitride HEMT 300B is implemented as a MISFET having insulated gate 346. However, it is noted that, like III-Nitride HEMT 300A, III-Nitride HEMT 300B may be implemented as a depletion mode (normally ON) or an enhancement mode (normally OFF) device.

As described above by reference to FIG. 3A, barrier enhancement layer 330 is configured to work in combination with barrier layer 328 to reduce or substantially prevent charge trapping by trap sites found in or at the interface of dielectric layer 320 with barrier enhancement layer 330. For example, barrier enhancement layer 330 serves to increase the energy barrier between channel layer 310 and dielectric layer 320, thereby enhancing the confinement of electrons within channel layer 310. As a result, the degradation in III-Nitride HEMT performance due to charge trapping in conventional device structures is reduced or substantially eliminated in III-Nitride HEMT 300B due to the presence of barrier enhancement layer 330.

Figure 4A:
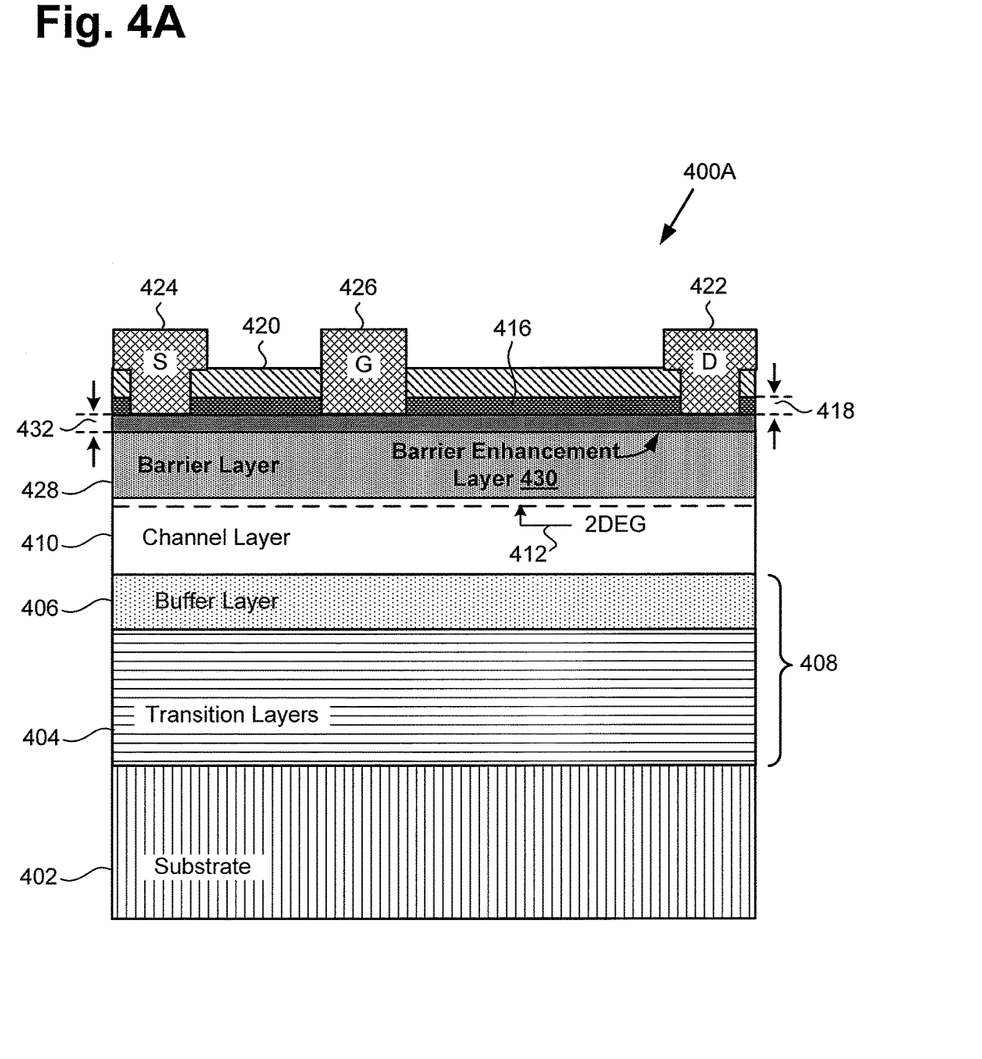
FIG. 4A shows a cross-sectional view of an exemplary III-Nitride HEMT including a barrier enhancement layer and a charge trapping prevention layer, according to one implementation.

Referring to FIG. 4A, FIG. 4A shows a cross-sectional view of exemplary III-Nitride HEMT 400A including a barrier enhancement layer and a charge trapping prevention layer, according to one implementation. As shown in FIG. 4A, III-Nitride HEMT 400A includes substrate 402, and III-Nitride intermediate body 408 including transition layers 404 and buffer layer 406, situated over substrate 402. In addition, FIG. 4A shows channel layer 410 situated over III-Nitride intermediate body 408, and barrier layer 428 situated over channel layer 410 so as to produce 2DEG 412. Also shown in FIG. 4A are dielectric layer 420 situated over barrier layer 428, and barrier enhancement layer 430 having thickness 432 and charge trapping prevention layer 416 having thickness 418, both of which are situated between dielectric layer 420 and barrier layer 428.

Moreover, and as further shown in FIG. 4A, III-Nitride HEMT 400A includes drain electrode 422, source electrode 424, and gate 426. According to the exemplary implementation shown in FIG. 4A, each of drain electrode 422 and source electrode 424 extends through dielectric layer 420, and further extends through charge trapping prevention layer 416, to make ohmic contact with barrier enhancement layer 430 and charge trapping prevention layer 416. However, it is noted that in other implementations drain electrode 422 and source electrode 424 may be situated on and make ohmic contact with charge trapping prevention layer 416, or may extend through barrier enhancement layer 430 to make ohmic contact with barrier layer 428, barrier enhancement layer 430, and charge trapping prevention layer 416. It is further noted that in other implementations, gate 426 may be situated on charge trapping prevention layer 416, or may extend through barrier enhancement layer 430 to make contact, such as Schottky contact, for example, with barrier layer 428. In various applications, III-Nitride HEMT 400A may be implemented as a depletion mode (normally ON) or an enhancement mode (normally OFF) device.

Substrate 402, III-Nitride intermediate body 408, channel layer 410, dielectric layer 420, drain electrode 422, source electrode 424, and gate 426 correspond in general respectively to substrate 102, III-Nitride intermediate body 108, channel layer 110, dielectric layer 120, drain electrode 122, source electrode 124, and gate 126, in FIG. 1A, and may share any of the characteristics attributed to those corresponding features in the present application.

Barrier layer 428 and barrier enhancement layer 430 having thickness 432 correspond respectively in general to barrier layer 328 and barrier enhancement layer 330 having thickness 332, in FIG. 3A, and may share any of the characteristics attributed to those corresponding features in the present application. That is to say, barrier layer 428 may be an AlGaN layer having a relatively low aluminum concentration in a range of approximately 10%-21%. Moreover, barrier enhancement layer 430 may have an aluminum concentration greater than or approximately equal to 23%, and may be formed over barrier layer 428 to thickness 432 of a few nanometers, such as a thickness of less than or approximately equal to 3 nm, for example. However, in other implementations, thickness 432 of barrier enhancement layer 430 may be greater than a few nanometers.

As shown in FIG. 4A, charge trapping prevention layer 416 may be situated over barrier layer 428, between barrier enhancement layer 430 and dielectric layer 420. Charge trapping prevention layer 416 having thickness 418 corresponds in general to charge trapping prevention layer 116 having thickness 118, in FIG. 1A, and may share any of the characteristics attributed to that corresponding feature in the present application.

Barrier enhancement layer 430 and charge trapping prevention layer 416 are configured to work in combination with barrier layer 428 to reduce or substantially prevent charge trapping by trap sites found in or at the interface of dielectric layer 420 with charge trapping prevention layer 416. For example, barrier enhancement layer 430 and charge trapping prevention layer 416 serve to increase the energy barrier between channel layer 410 and dielectric layer 420, thereby enhancing the confinement of electrons within channel layer 410. As a result, the degradation in III-Nitride HEMT performance due to charge trapping in conventional device structures is reduced or substantially eliminated in III-Nitride HEMT 400A due to the presence of barrier enhancement layer 430 and charge trapping prevention layer 416.

Figure 4B:
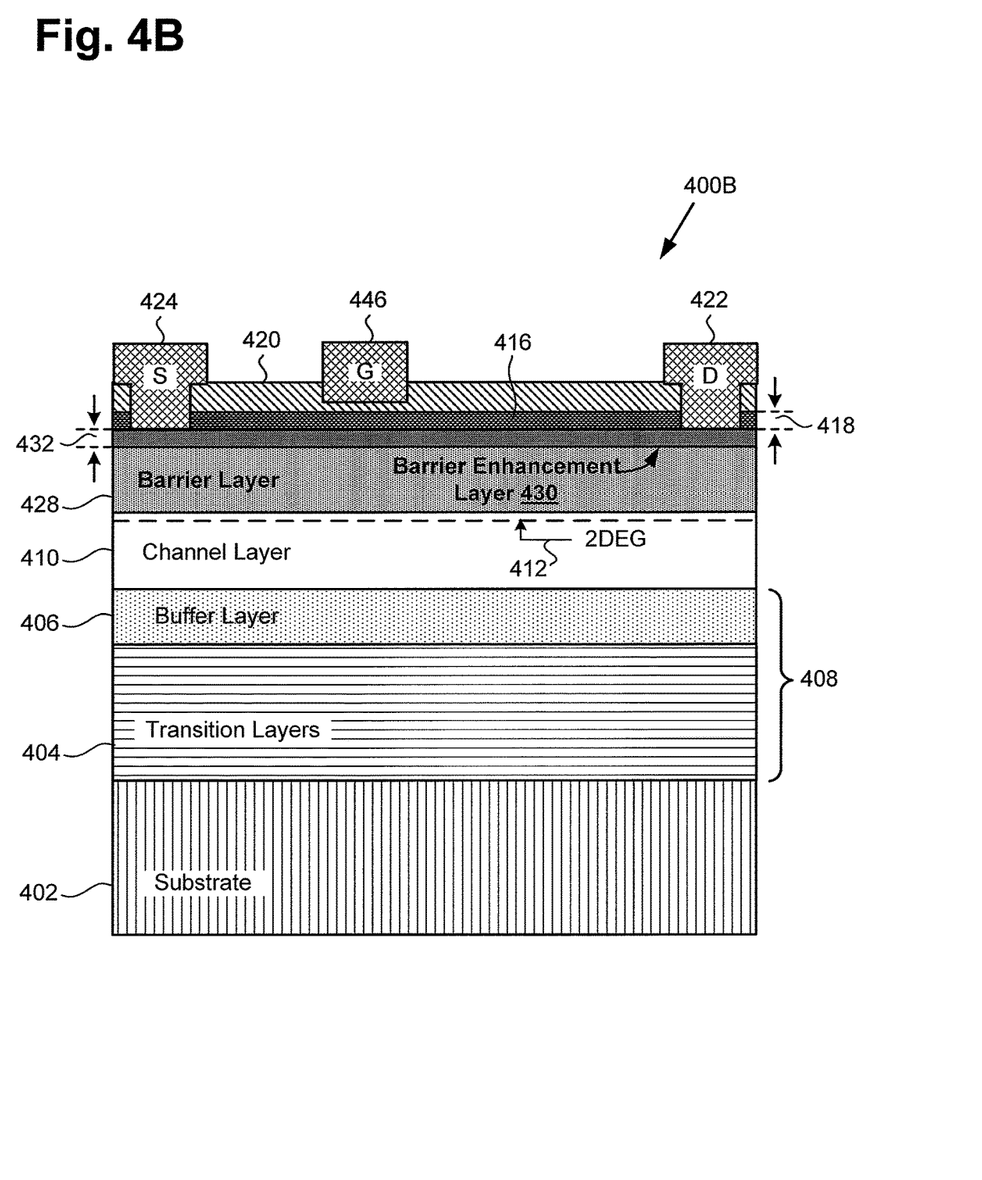
FIG. 4B shows a cross-sectional view of an exemplary III-Nitride HEMT including a barrier enhancement layer and a charge trapping prevention layer, according to another implementation.

Continuing to FIG. 4B, FIG. 4B shows a cross-sectional view of exemplary III-Nitride HEMT 400B including a barrier enhancement layer and a charge trapping prevention layer, according to another implementation. It is noted that the features in FIG. 4B identified by reference numbers identical to those shown in FIG. 4A correspond respectively to those previously described features and may share any of the characteristics attributed to those corresponding features, above. III-Nitride HEMT 400B differs from III-Nitride HEMT 400A, in FIG. 4A, in that III-Nitride HEMT 400B is implemented as a MISFET having insulated gate 446. However, it is noted that, like III-Nitride HEMT 400A, III-Nitride HEMT 400B may be implemented as a depletion mode (normally ON) or an enhancement mode (normally OFF) device.

As described above by reference to FIG. 4A, barrier enhancement layer 430 and charge trapping prevention layer 416 are configured to work in combination with barrier layer 428 to reduce or substantially prevent charge trapping by trap sites found in or at the interface of dielectric layer 420 with charge trapping prevention layer 416. For example, barrier enhancement layer 430 and charge trapping prevention layer 416 serve to increase the energy barrier between channel layer 410 and dielectric layer 420, thereby enhancing the confinement of electrons within channel layer 410. As a result, the degradation in III-Nitride HEMT performance due to charge trapping in conventional device structures is reduced or substantially eliminated in III-Nitride HEMT 400B due to the presence of barrier enhancement layer 430 and charge trapping prevention layer 416.

Figure 5A:
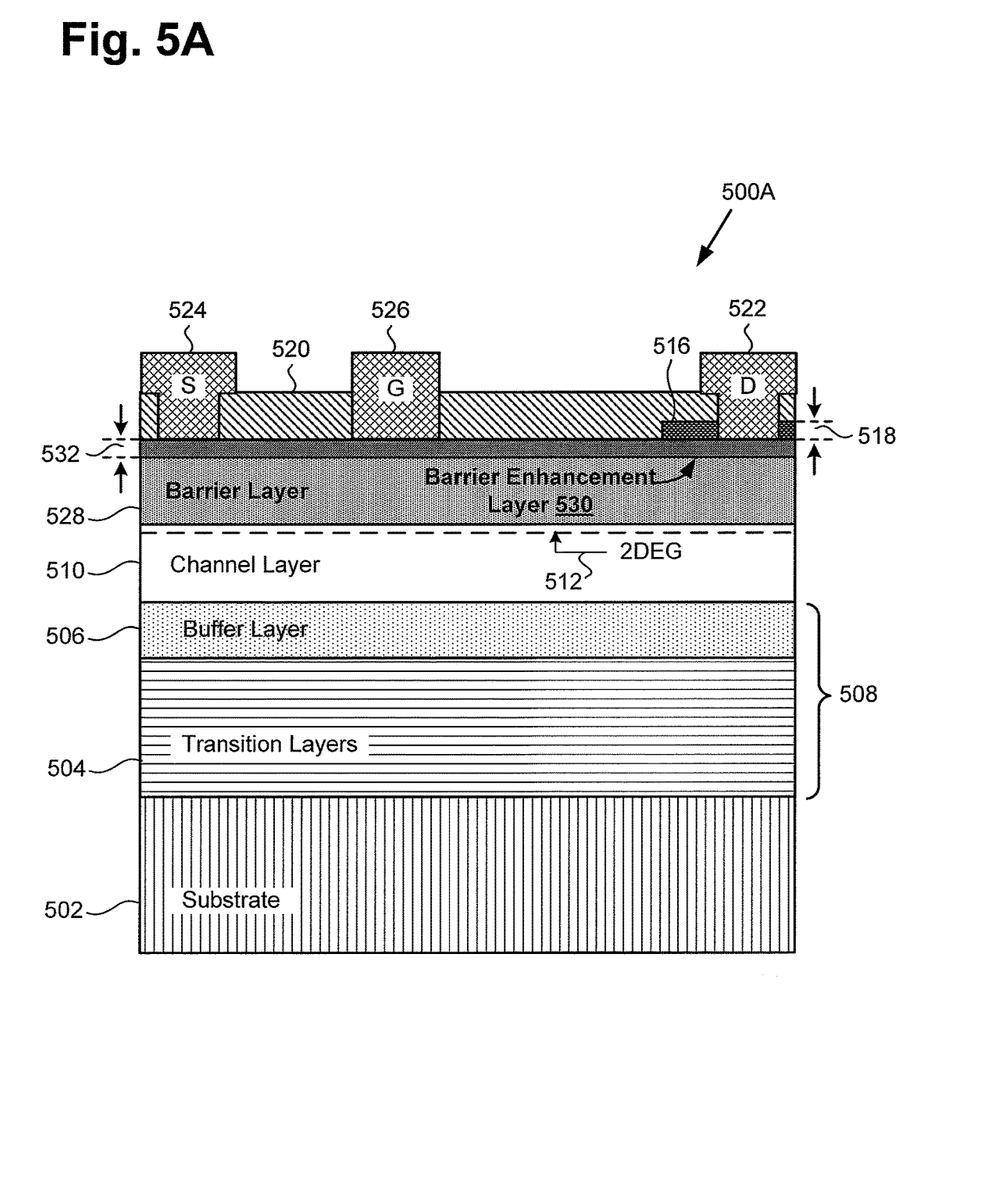
FIG. 5A shows a cross-sectional view of an exemplary III-Nitride HEMT including a barrier enhancement layer and a charge trapping prevention layer, according to another implementation.

Referring to FIG. 5A, FIG. 5A shows a cross-sectional view of exemplary III-Nitride HEMT 500A including a barrier enhancement layer and a charge trapping prevention layer, according to another implementation. As shown in FIG. 5A, III-Nitride HEMT 500A includes substrate 502, and III-Nitride intermediate body 508 including transition layers 504 and buffer layer 506, situated over substrate 502. In addition, FIG. 5A shows channel layer 510 situated over III-Nitride intermediate body 508, and barrier layer 528 situated over channel layer 510 so as to produce 2DEG 512. III-Nitride HEMT 500A further includes drain electrode 522, source electrode 524, and gate 526.

Also shown in FIG. 5A are dielectric layer 520 situated over barrier layer 528, and barrier enhancement layer 530 having thickness 532 and charge trapping prevention layer 516 having thickness 518 situated between dielectric layer 520 and barrier layer 528. It is noted, however, that according to the exemplary implementation shown in FIG. 5A, charge trapping prevention layer 516 is situated between dielectric layer 520 and barrier layer 528 only in the vicinity of drain electrode 522. It is noted that in various applications, III-Nitride HEMT 500A may be implemented as a depletion mode (normally ON) or an enhancement mode (normally OFF) device.

Substrate 502, III-Nitride intermediate body 508, channel layer 510, dielectric layer 520, drain electrode 522, and gate 526 correspond in general respectively to substrate 102, III-Nitride intermediate body 108, channel layer 110, dielectric layer 120, drain electrode 122, and gate 126, in FIG. 1A, and may share any of the characteristics attributed to those corresponding features in the present application.

Barrier layer 528 and barrier enhancement layer 530 having thickness 532 correspond respectively in general to barrier layer 328 and barrier enhancement layer 330 having thickness 332, in FIG. 3A, and may share any of the characteristics attributed to those corresponding features in the present application. That is to say, barrier layer 528 may be an AlGaN layer having a relatively low aluminum concentration in a range of approximately 10%-21%. Moreover, barrier enhancement layer 530 may have an aluminum concentration greater than or approximately equal to 23%, and may be formed over barrier layer 528 to thickness 532 of a few nanometers, such as a thickness of less than or approximately equal to 3 nm, for example. However, in other implementations, thickness 532 of barrier enhancement layer 530 may be greater than a few nanometers.

Charge trapping prevention layer 516 having thickness 518, in FIG. 5A, corresponds in general to charge trapping prevention layer 116 having thickness 118, in FIG. 1A, and may share any of the characteristics attributed to that corresponding feature in the present application.

As noted above, charge trapping may be especially problematic in the vicinity of drain electrode 522, but may not be as great a concern in the vicinity of source electrode 524 and gate 526. In those situations, it may be advantageous or desirable to confine charge trapping prevention layer 516 so as to overlie barrier enhancement layer 530 only in regions adjoining or closely adjacent to drain electrode 522.

In other words, and as shown in FIG. 5A, in some implementations, charge trapping prevention layer 516 does not overlie barrier enhancement layer 530 between source electrode 524 and gate 526. Consequently, although drain electrode 522 extends through dielectric layer 520 and further extends through charge trapping prevention layer 516 to make ohmic contact with barrier enhancement layer 530 and charge trapping prevention layer 516, source electrode 524 does not. Instead, source electrode 524 merely extends through dielectric layer 520 to make ohmic contact with barrier enhancement layer 530.

It is noted that although FIG. 5A depicts drain electrode 522 as extending through charge trapping prevention layer 516 to make ohmic contact with barrier enhancement layer 530 and charge trapping prevention layer, in other implementations drain electrode 522 may be situated on and make ohmic contact with charge trapping prevention layer 516, or may extend through barrier enhancement layer to make ohmic contact with barrier layer 528, barrier enhancement layer 530, and charge trapping prevention layer 516. Moreover, in other implementations, source electrode 524 may extend through barrier enhancement layer 530 to make ohmic contact with barrier layer 528 and barrier enhancement layer 530.

Barrier enhancement layer 530 and charge trapping prevention layer 516 are configured to work in combination with barrier layer 528 to reduce or substantially prevent charge trapping by trap sites found in or at the interface of dielectric layer 520 with charge trapping prevention layer 516. For example, barrier enhancement layer 530 and charge trapping prevention layer 516 serve to increase the energy barrier between channel layer 510 and dielectric layer 520 in the vicinity of drain electrode 522, thereby enhancing the confinement of electrons within channel layer 510. As a result, the degradation in III-Nitride HEMT performance due to charge trapping in conventional device structures is reduced or substantially eliminated in III-Nitride HEMT 500A due to the presence of barrier enhancement layer 530, and further due to the presence of charge trapping prevention layer 516 in the vicinity of drain electrode 522.

Figure 5B:
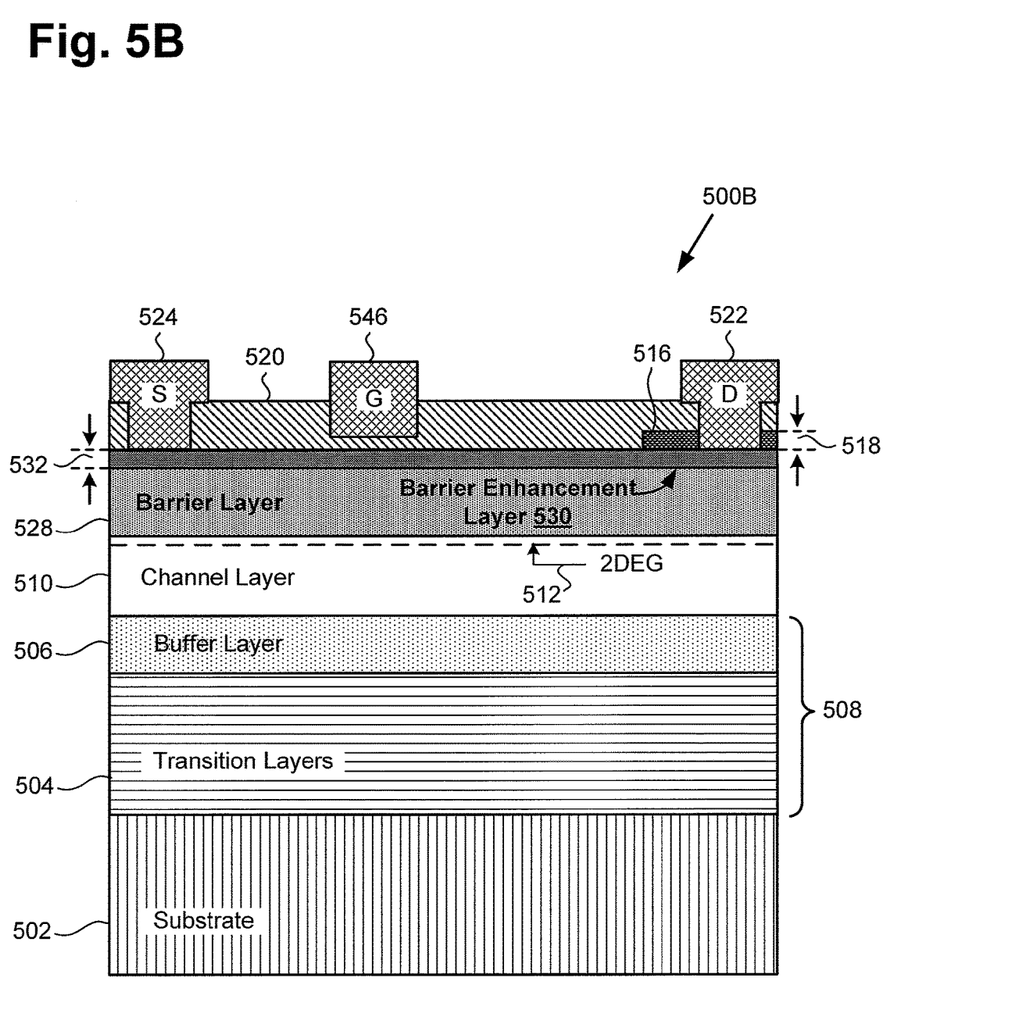
FIG. 5B shows a cross-sectional view of an exemplary III-Nitride HEMT including a barrier enhancement layer and a charge trapping prevention layer, according to yet another implementation.

Continuing to FIG. 5B, FIG. 5B shows a cross-sectional view of exemplary III-Nitride HEMT 500B including a barrier enhancement layer and a charge trapping prevention layer, according to yet another implementation. It is noted that the features in FIG. 5B identified by reference numbers identical to those shown in FIG. 5A correspond respectively to those previously described features and may share any of the characteristics attributed to those corresponding features, above. III-Nitride HEMT 500B differs from III-Nitride HEMT 500A, in FIG. 5A, in that III-Nitride HEMT 500B is implemented as a MISFET having insulated gate 546. However, it is noted that, like III-Nitride HEMT 500A, III-Nitride HEMT 500B may be implemented as a depletion mode (normally ON) or an enhancement mode (normally OFF) device.

As described above by reference to FIG. 5A, barrier enhancement layer 530 and charge trapping prevention layer 516 are configured to work in combination with barrier layer 528 to reduce or substantially prevent charge trapping by trap sites found in or at the interface of dielectric layer 520 with charge trapping prevention layer 516. For example, barrier enhancement layer 530 and charge trapping prevention layer 516 serve to increase the energy barrier between channel layer 510 and dielectric layer 520 in the vicinity of drain electrode 522, thereby enhancing the confinement of electrons within channel layer 510. As a result, the degradation in III-Nitride HEMT performance due to charge trapping in conventional device structures is reduced or substantially eliminated in III-Nitride HEMT 500B due to the presence of barrier enhancement layer 530, and further due to the presence of charge trapping prevention layer 516 in the vicinity of drain electrode 522.

Thus, the present application discloses III-Nitride HEMTs configured such that the disadvantages associated with charge trapping in conventional device structures are reduced or substantially eliminated. According to various implementations disclosed by the present application, one or more layers providing charge trap prevention may be formed so as to overlie at least a portion of the active barrier layer of the III-Nitride HEMT. In those disclosed implementations, such a layer or layers are configured to increase the energy barrier above the channel layer of the III-Nitride HEMT in which the 2DEG is generated, thereby advantageously increasing confinement of electrons within the HEMT 2DEG.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A III-Nitride high electron mobility transistor (HEMT) comprising:
   a III-Nitride intermediate body situated over a substrate;
   a channel layer situated over said III-Nitride intermediate body, and a barrier layer situated over said channel layer, said channel layer and said barrier layer being configured to produce a two-dimensional electron gas (2DEG);
   a dielectric layer situated over said barrier layer;
   a gate coupled to said barrier layer, and a drain electrode and a source electrode each extending through said dielectric layer;
   a charge trapping prevention layer situated between said dielectric layer and said barrier layer;
   wherein said drain electrode makes ohmic contact with at least one of said charge trapping prevention layer and said barrier layer;
   wherein said charge trapping prevention layer is devoid of P type dopants;
   wherein said charge trapping prevention layer overlies said barrier layer only between said drain electrode and said gate,
   wherein said charge trapping prevention layer substantially prevents charge trapping by trap sites found in or at an interface between said dielectric layer and said charge trapping prevention layer.

2. The III-Nitride HEMT of claim 1, wherein said source electrode makes ohmic contact with at least one of said charge trapping prevention layer and said barrier layer.

3. The III-Nitride HEMT of claim 1, wherein said charge trapping prevention layer is an undoped III-Nitride layer selected from the group consisting of gallium nitride (GaN), indium gallium nitride (InGaN), indium nitride (InN), and aluminum indium gallium nitride (AlInGaN).

4. The III-Nitride HEMT of claim 1, wherein said channel layer comprises GaN, and said barrier layer comprises an aluminum gallium nitride (AlGaN) layer having an aluminum concentration of greater than or approximately equal to ten percent (10%).

5. The III-Nitride HEMT of claim 1, wherein said charge trapping prevention layer has a thickness of less than or approximately equal to five nanometers (5 nm).

6. The III-Nitride HEMT of claim 1, wherein said charge trapping prevention layer terminates prior to said gate so that said charge trapping prevention layer does not overlie a portion of said barrier layer between said drain electrode and said gate.

7. The III-Nitride HEMT of claim 6, wherein said charge trapping prevention layer is present only in regions adjoining the drain electrode.

8. The III-Nitride HEMT of claim 1, wherein said charge trapping prevention layer is of a substantially uniform thickness.

9. A III-Nitride high electron mobility transistor (HEMT) comprising:
   a III-Nitride intermediate body situated over a substrate;
   a channel layer situated over said III-Nitride intermediate body, and a barrier layer situated over said channel layer, said channel layer and said barrier layer being configured to produce a two-dimensional electron gas (2DEG);
   a barrier enhancement layer situated over said barrier layer;
   a dielectric layer situated over said barrier enhancement layer;
   a gate coupled to said barrier enhancement layer, and a drain electrode and a source electrode each extending through said dielectric layer;
   a charge trapping prevention layer situated between said dielectric layer and said barrier enhancement layer;
   wherein said drain electrode makes ohmic contact with at least one of said charge trapping prevention layer, said barrier enhancement layer, and said barrier layer;
   wherein said charge trapping prevention layer is devoid of P type dopants;
   wherein said charge trapping prevention layer overlies said barrier enhancement layer only between said drain electrode and said gate,
   wherein said barrier enhancement layer and said charge trapping prevention layer substantially prevent charge trapping by trap sites found in or at an interface between said dielectric layer and said charge trapping prevention layer.

10. The III-Nitride HEMT of claim 9, wherein said source electrode makes ohmic contact with at least one of said charge trapping prevention layer, said barrier enhancement layer, and said barrier layer.

11. The III-Nitride HEMT of claim 9, wherein said charge trapping prevention layer is an undoped III-Nitride layer selected from the group consisting of gallium nitride (GaN), indium gallium nitride (InGaN), indium nitride (InN), and aluminum indium gallium nitride (AlInGaN).

12. The III-Nitride HEMT of claim 9, wherein said channel layer comprises gallium nitride (GaN), and said barrier layer comprises an aluminum gallium nitride (AlGaN) layer having an aluminum concentration in a range from approximately ten percent to approximately twenty-one percent (10%-21%).

13. The III-Nitride HEMT of claim 12, wherein said barrier enhancement layer comprises another AlGaN layer having an aluminum concentration of greater than or approximately equal to 23%.

14. The III-Nitride HEMT of claim 9, wherein said charge trapping prevention layer has a thickness of less than or approximately equal to five nanometers (5 nm).

15. The III-Nitride HEMT of claim 9, wherein said barrier enhancement layer has a thickness of less than or approximately equal to 5 nm.

16. The III-Nitride HEMT of claim 9, wherein said charge trapping prevention layer terminates prior to said gate so that said charge trapping prevention layer does not overlie a portion of said barrier enhancement layer between said drain electrode and said gate.

17. The III-Nitride HEMT of claim 16, wherein said charge trapping prevention layer is present only in regions adjoining the drain electrode.

18. The III-Nitride HEMT of claim 9, wherein said charge trapping prevention layer is of a substantially uniform thickness.

* * * * *